United States Patent
Ahdoot

(10) Patent No.: US 10,809,774 B2
(45) Date of Patent: Oct. 20, 2020

(54) FLUID FLOW TUNNELLING IN A NON-METALLIC COMPUTER CHASSIS

(71) Applicant: HYPERTECHNOLOGIE CIARA INC., Saint-Laurent (CA)

(72) Inventor: Eliot Ahdoot, Dollard-des-Ormeaux (CA)

(73) Assignee: HYPERTECHNOLOGIE CIARA INC., Saint-Laurent (CA)

( * ) Notice: Subject to any disclaimer, the term of this patent is extended or adjusted under 35 U.S.C. 154(b) by 0 days.

(21) Appl. No.: 16/316,975

(22) PCT Filed: Aug. 11, 2017

(86) PCT No.: PCT/CA2017/050952
§ 371 (c)(1),
(2) Date: Jan. 10, 2019

(87) PCT Pub. No.: WO2018/027325
PCT Pub. Date: Feb. 15, 2018

(65) Prior Publication Data
US 2019/0317569 A1      Oct. 17, 2019

Related U.S. Application Data

(60) Provisional application No. 62/374,122, filed on Aug. 12, 2016.

(51) Int. Cl.
*G06F 1/20*   (2006.01)
*H05K 7/20*   (2006.01)

(52) U.S. Cl.
CPC .......... *G06F 1/20* (2013.01); *H05K 7/20145* (2013.01); *H05K 7/20172* (2013.01); *G06F 2200/201* (2013.01)

(58) Field of Classification Search
CPC ...... G06F 1/20; G06F 2200/201; G06F 1/181; G06F 1/206; G06F 1/16; H05K 7/20145;
(Continued)

(56) References Cited

U.S. PATENT DOCUMENTS 4,958,257 A     9/1990  Wenke
5,473,507 A *  12/1995  Schwegler .............. G06F 1/183
                                                              361/690

(Continued)

FOREIGN PATENT DOCUMENTS

WO      2000041449      7/2000
WO      2014030046      2/2014

OTHER PUBLICATIONS

Charles, Mougeot, International Search Report PCT/CA2017/050952. Form PCT/ISA/210. dated Jan. 22, 2018, 3 pages.

*Primary Examiner* — Mandeep S Buttar
(74) *Attorney, Agent, or Firm* — Benoit & Cote, Inc.; C. Marc Benoit; Charles-Andre Caron

(57) ABSTRACT

There is provided a chassis for a computing system comprising a heat-generating element. The chassis comprises a body with at least a portion thereof made of a non-metallic material, namely a nonmetallic portion. For example, the non-metallic material can be a moldable plastic. There is provided a channel made in the non-metallic portion, the channel having a starting point close to a dedicated location for a fan, the channel having an ending point close to a dedicated portion for the heat-generating element, the channel shaped to guide fluid propelled at the starting point to the ending point. The channel can be a tunnel inside the body or a valley on the surface of the body, and confines fluid flow from the fan, guiding the fluid flow to the heat-generating element.

11 Claims, 6 Drawing Sheets

(58) Field of Classification Search
CPC .......... H05K 7/20172; H05K 7/20727; H05K 7/20772; H05K 9/0047; H05K 7/20209; H05K 1/0203; H05K 7/20; H05K 7/20136; H01L 2924/0002; H01L 2924/00; H01L 23/467; F28D 15/0233; F28D 1/024
USPC ......... 361/679.49, 679.54, 704, 679.46, 695, 361/690, 679.48, 679.5; 165/104.33
See application file for complete search history.

(56) References Cited

U.S. PATENT DOCUMENTS

| | | | |
|---|---|---|---|
| 5,644,472 A * | 7/1997 | Klein | G06F 1/20 361/679.48 |
| 6,018,125 A | 1/2000 | Collins et al. | |
| 6,735,081 B1 * | 5/2004 | Bishop | H05K 7/20727 165/104.33 |
| 6,873,528 B2 | 3/2005 | Hulan et al. | |
| 7,173,822 B2 | 2/2007 | Liang et al. | |
| 8,021,752 B2 | 9/2011 | Honda et al. | |
| 8,094,453 B2 | 1/2012 | Campbell et al. | |
| 8,116,076 B2 | 2/2012 | Cochrane | |
| 8,171,142 B2 | 5/2012 | Kolin et al. | |
| 8,240,490 B2 | 8/2012 | Malekmadani | |
| 8,755,192 B1 * | 6/2014 | Schrempp | G06F 1/20 361/679.5 |
| 9,198,309 B2 | 11/2015 | Aurongzeb et al. | |
| 2003/0223197 A1 | 12/2003 | Hulan et al. | |
| 2004/0232098 A1 | 11/2004 | Or | |
| 2008/0006444 A1 | 1/2008 | Cochrane | |
| 2011/0075367 A1 | 3/2011 | Campbell et al. | |
| 2011/0290685 A1 | 12/2011 | Kenney | |
| 2011/0310553 A1 | 12/2011 | Hsiao | |
| 2012/0021196 A1 | 1/2012 | Kenney | |
| 2016/0034005 A1 | 2/2016 | Hoss et al. | |
| 2016/0088774 A1 * | 3/2016 | Alvarado | H05K 7/20736 361/679.46 |

* cited by examiner

FLUID FLOW TUNNELLING IN A NON-METALLIC COMPUTER CHASSIS

BACKGROUND

(a) Field

The subject matter disclosed generally relates to computer chassis. More specifically, it relates to the cooling of non-metallic chassis.

(b) Related Prior Art

Computer servers and other types of computers are increasingly popular for a variety of purposes. Various ways to reduce the space occupied by components within the server are desired. Furthermore, most of the cost for operating a server comes from the electricity needed to operate the server and the space required to store the servers.

SUMMARY

According to an aspect of the invention, there is provided a chassis for a computing system comprising a heat-generating element, the chassis comprising:
  a body with at least a portion thereof made of a non-metallic material, namely a non-metallic portion;
  a channel made in the non-metallic portion, the channel having a starting point close to a dedicated location for a fan, the channel having an ending point close to a dedicated portion for the heat-generating element, the channel shaped to guide fluid propelled at the starting point to the ending point.

According to an embodiment, the non-metallic material comprises plastic.

According to an embodiment, the chassis comprises a chassis base having a base flat portion extending in a plane, the non-metallic portion extending from the flat portion away from the plane.

According to an embodiment, the chassis comprises a chassis lid having a lid flat portion extending in a plane, the non-metallic portion extending from the flat portion away from the plane.

According to an embodiment, the channel comprises a tunnel defining a path between the starting point and the ending point.

According to an embodiment, the body has a surface and the channel comprises a valley open to the surface and defining a path between the starting point and the ending point.

According to an embodiment, the channel comprises a plurality of channels, each channel having its starting point by a dedicated one of a plurality of fans and its ending point by a dedicated one of a plurality of heat-generating elements.

According to an embodiment, the channel comprises a plurality of channels, some of the channels sharing a starting point by a dedicated one of a plurality of fans, each of the channels having and its ending point by a dedicated one of a plurality of heat-generating element.

According to an embodiment, the channel comprises a plurality of channels, the channels defining a network having a plurality of starting points and a plurality of ending points greater than the plurality of starting points, the channels defining paths from the plurality of starting points and splitting to the greater plurality of ending points.

According to another aspect of the invention, there is provided a method of fabricating a chassis for a computing system comprising a heat-generating element, the method comprising:
  molding at least a portion of a body of the chassis made of a non-metallic material, namely a non-metallic portion;
  providing a channel in the body, the channel having a starting point and an ending point and defining a path therebetween to allow fluid flow.

According to an embodiment, there is further provided identifying a location in the chassis at which a fan and a heat-generating element are to be installed to mold the non-metallic portion with the starting point and the ending point at appropriate locations.

According to an embodiment, there is further provided identifying a requirement of fluid flow for cooling down a specific heat-generating element and providing the channel with sizing that is sufficient to reach the requirement of fluid flow.

According to an embodiment, molding comprises molding the non-metallic portion by shaping the non-metallic portion as a bulk material extending away from a plane of a flat portion of a chassis lid or a chassis base and inside which channels are molded.

According to an embodiment, providing a channel comprises molding the channel while molding the non-metallic portion.

According to an embodiment, providing a channel comprises modifying non-metallic portion to form the channel therein after molding the non-metallic portion.

According to an embodiment, providing a channel comprises providing a plurality of independent channels.

According to an embodiment, providing a channel comprises providing a plurality of channels forming a network.

As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Fans are always a major electricity-consuming element in servers and all types of computers. Fans are also notable for requiring space. There is contemplated below a way to reduce the number of fans inside a server rack, and/or to use less electric power to feed the fans while still sufficiently cooling down heat-generating elements in a server rack. Channels formed in non-metallic portions of the chassis can be used to confine air flow from the fans and guide the air flow to a specific location to reduce the number of fans inside a server rack, and/or to use less electric power to feed the fans. A chassis usually comprising flat portions (one for the base and one for the lid) may thus be provided with a non-metallic portion that extends in space above or under one of the flat portions, forming a body extending away from the plane of the flat portion and inside which the channels are formed.

Figure 1:
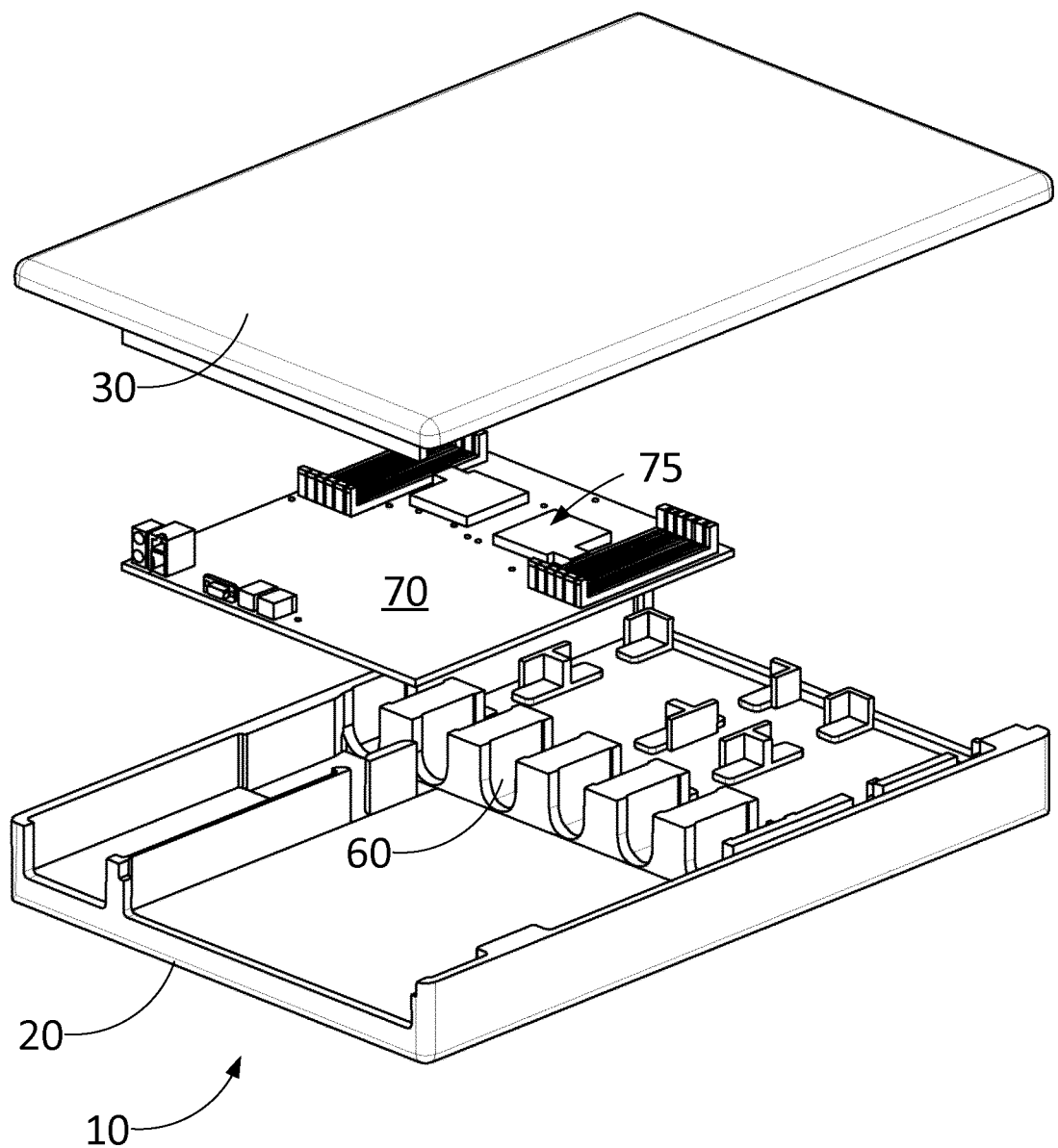
FIG. 1 is a perspective view illustrating a computer chassis, according to the prior art.

Referring to FIG. 1, there is shown a chassis 10 as found in the prior art, comprising a chassis base 20 and a chassis lid 30. The fan location 60 is shown in FIG. 1; all following figures have the same fan location for the purpose of comparison.

Figure 2:
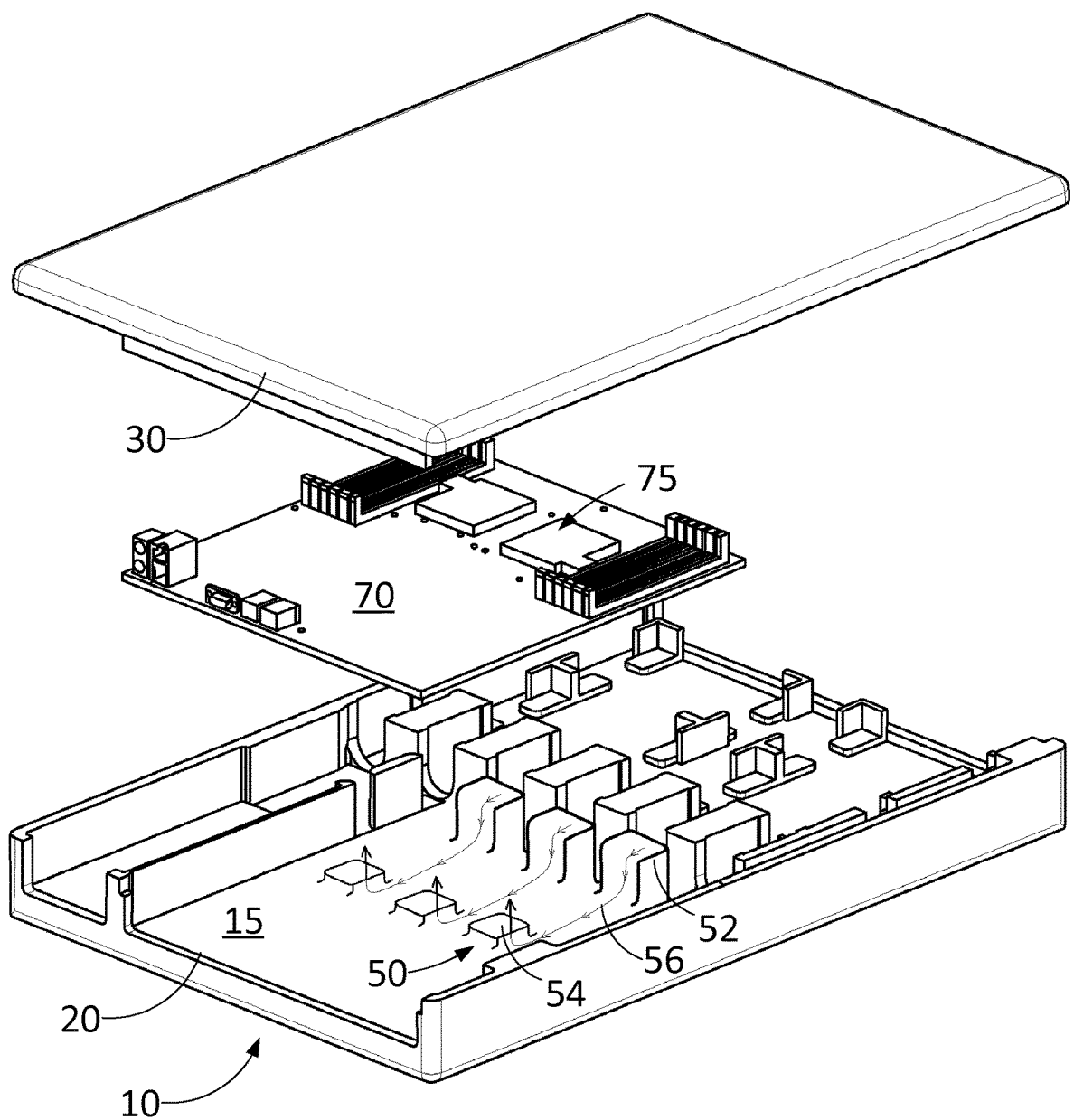
FIG. 2 is a perspective view illustrating a computer chassis with channels in a non-metallic portion of the chassis base, according to an embodiment.

Referring now to FIG. 2, at least one of the chassis base 20 and the chassis lid 30 is made at least in part of a non-metallic material, such as a plastic or composite material. This forms the non-metallic chassis portion 15. The non-metallic chassis portion 15 should thus form a substantial portion of the chassis base 20 and/or the chassis lid 30, and extends as a body formed of a molded bulk material over the flat portion of the chassis base 20 and/or under the flat portion of the chassis lid 30, both flat portions being substantially flat and extending in their respecting planes. The body formed of a molded bulk material thus extends away from the plane of the lid flat portion or the plane of the base flat portion.

According to an embodiment, the chassis base 20 and the chassis lid 30 are both substantially completely made of a non-metallic material. Alternatively, only one of them can be substantially completely made of a non-metallic material. According to an embodiment, the non-metallic material is plastics.

Having at least one of the chassis base 20 and the chassis lid 30 substantially completely made of plastics is advantageous in that it allows molding (or building or shaping plastics in any other practical manner) the non-metallic chassis portion 15. The type of plastic used for the non-metallic chassis portion 15 should be chosen to ensure that the plastic is moldable.

There have been attempts to introduce on the market non-metallic server racks, i.e., server racks having chassis made of polymer and/or of a composite material.

Using these materials is advantageous in that it allows reducing production cost. However, switching from metal to polymers and composites implies that the advantages of the metallic materials, not inherently found in polymers and composites, must be obtained in another way. More specifically, a new way to electrically ground the rack should be found. Moreover, whereas the metallic rack intrinsically forms an electromagnetic shield around the equipment, the same does not hold for polymer or composite racks. This issue should also be addressed.

Electromagnetic shielding (also known as EMI shielding) is an expected functionality of a chassis in general, since the circuit board installed in the chassis 10 should be protected from electromagnetic radiations. A conductive coating can be added on the surface of the non-metallic chassis portion 15 to provide electromagnetic shielding for the chassis.

Other solutions, such as providing electromagnetic shielding materials within the composite material that could form the non-metallic chassis portion 15, are also possible.

The materials used for electromagnetic shielding can also be used for electrically grounding the chassis.

The possibility to mold the non-metallic chassis portion 15 provides a way to add complexity to the shape of this chassis portion, compared to the usual shapes that can be produced when metallic materials are used. Interestingly, compared to usual metallic racks, increasingly original and complicated shapes can be achieved since server racks made of plastic materials can be molded (e.g., injection molding) or otherwise fabricated (e.g., 3-D printed) into these non-standard shapes.

This new flexibility in the design of shapes of portions of chassis brings new possibilities regarding the way fans are used to propel air to heat-generating elements 75. Other fluids than air may also be used, although liquids require further care and fans may need to be replaced by pumps. Within the context of the present description, a fan is therefore considered as being a pump if the nature of the fluid requires it.

As mentioned above, incorporating plastic portions in the chassis 10 provides the advantage of molding the plastic portions of the chassis 10 in a shape different from existing standard chassis shapes that normally involve flat surfaces joined together to form enclosures, the surfaces including folded portions that make up walls of the enclosure. A new type of shape is contemplated herein.

In the embodiments shown in FIGS. 2-6, the non-metallic chassis portion 15 comprises a channel 50 formed therein for fluid flow. More specifically, the channel 50 formed therein can be used for ventilation, i.e., air flow for cooling purposes of heat-generating devices in the server.

The channel 50 can however be used with other types of fluids and for other purposes. For example, the channel 50 can be used to transport liquid nitrogen or even liquid helium for the most enthusiastic. Transport of water can also be considered but should bring additional considerations regarding the safety or workability of the setting.

Figure 5:
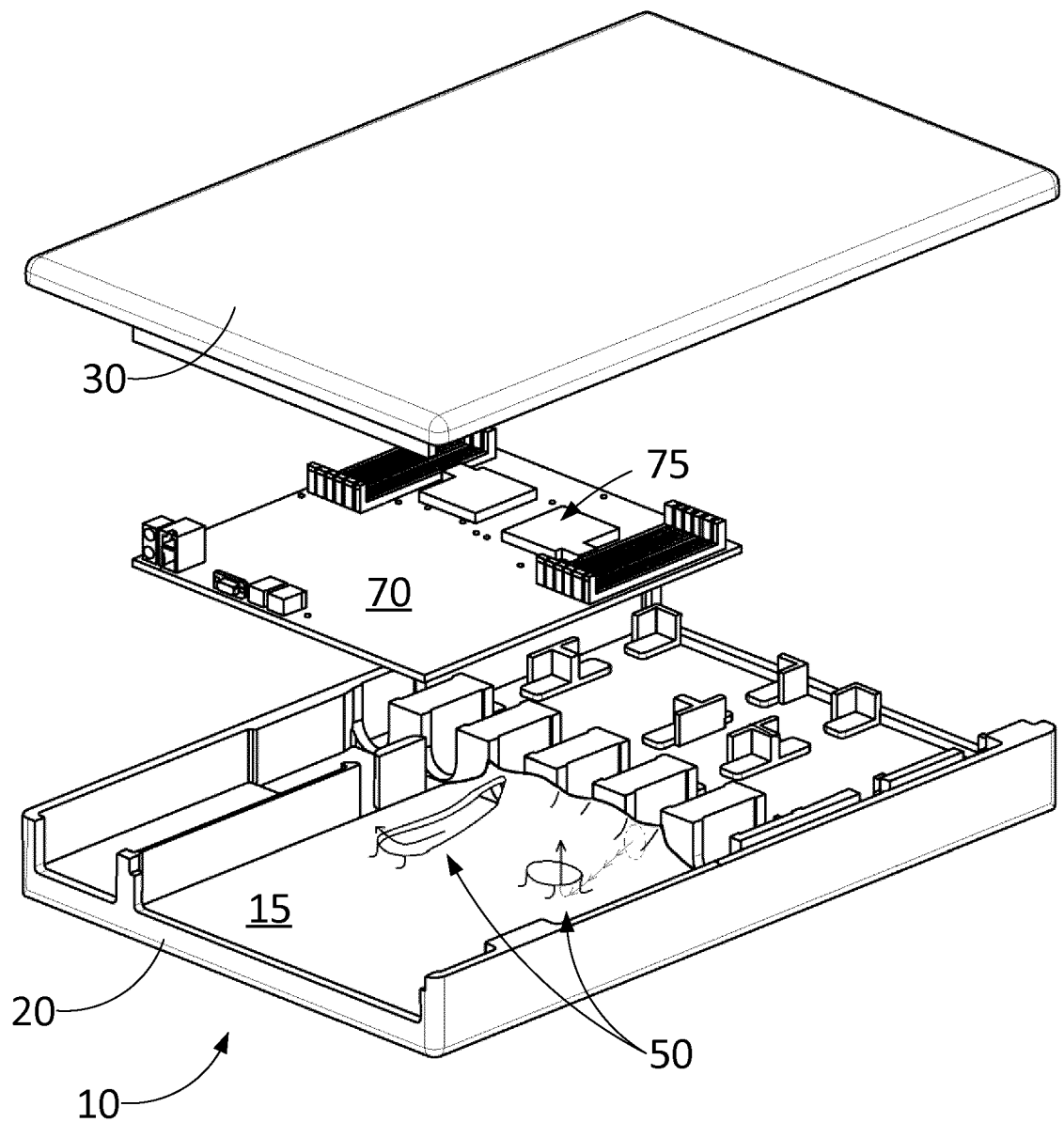
FIG. 5 is a perspective view illustrating a computer chassis with an open channel and a closed channel in a non-metallic portion, according to an embodiment.

The channel 50 can exist as a tunnel, i.e., it is a closed space defining a lumen through which the fluid travels while being confined therein. Alternatively, the channel 50 can be open, i.e., it is analog to an elongated "valley" or more generally a recess that is shaped inwardly on the surface of the non-metallic chassis portion 15. The closed channel and the open channel are shown in FIG. 5. The channel 50 can also be a hybrid between these shapes, i.e., it is closed as a tunnel on a portion thereof and, when the channel 50 extends closer to the surface of the non-metallic chassis portion 15, the channel 50 becomes an open recess.

When molding the non-metallic chassis portion 15, the channels 50, or a network comprising a plurality of channels 50, can be molded with the desired configuration. The exact topology of the network, or more simply the spatial path of each channel, and its shape and size, can be determined during design and made as required when the non-metallic chassis portion 15 is molded. FIGS. 2-5 illustrate straight paths, but the paths can be more sinuous and have complex shapes in space.

It implies that a plurality of channels can be provided in the non-metallic chassis portion 15 or in a plurality of non-metallic chassis portions 15 within the chassis 10, and each one of the channels may have the desired starting point, ending point, path between these points, shape, size, type (open or closed), etc. The channels 50 can merge or split and thus form a network of channels which does not necessarily have the same number of starting and ending points (usually, they split as there are more ending points). The channels 50 can also be provided as a plurality of independent channels 50 not interacting but being provided within the same body and defining their own path between their own starting point and ending point.

The channels 50 are normally built during the manufacturing of the chassis 10. The channels 50 can be pierced through the bulk material forming the body of the non-metallic chassis portion 15 (which extends above or under the usually flat portion of the chassis base 20 or the chassis lid 30) since this type of material can normally be pierced more easily than metallic materials. Tools such as a drill or the equivalent can advantageously be used to drill the non-metallic material to form a tunnel therein. Alternatively, a drill, rotary grinder, saw or the like can be used to form or dig a channel on the surface of the bulk material to form a surface channel thereon.

In another embodiment, the channel 50 is not formed by modifying the molded non-metallic chassis portion 15; it is rather formed by molding the channel 50 in the non-metallic chassis portion 15 when the bulk of the non-metallic chassis portion 15 is being molded. This can be done by ensuring the mold comprises a protuberance or any other protruding member that will prevent non-metallic material to occupy a given space within the non-metallic chassis portion 15 in order to ensure that upon solidification of the non-metallic chassis portion 15, this space is substantially void of any material and therefore forms a channel 50 inside the bulk material forming the body of the non-metallic chassis portion 15.

It is also possible to mold the non-metallic chassis portion 15 in two or more parts (e.g., one extends downwardly from the flat portion of the chassis lid 30 and the other one extends upwardly from the flat portion of the chassis base 20), where at least one of the parts has a portion of a channel 50 or a complete channel 50 molded therein (in the bulk material forming the body) or thereon (on the surface of the bulk material forming the body). When the two or more parts are assembled together, the resulting assembly should have the portions of channel 50 brought together such that the assembled parts of the non-metallic chassis portion 15 form the complete channel 50 by having the portions of the channel 50 complement themselves to ensure complete formation of the channel 50. For example, the non-metallic chassis portion 15 may be fabricated in two halves, each one of them having a half-moon hollow formed therein; when the two halves are assembled together, the half-moon hollows together form a tunnel having a shape of a cylinder. In another example, the non-metallic chassis portion 15 may be fabricated in two halves, each one of them having a hollow cylinder formed therein; when the two halves are assembled together, the end of one hollow cylinder is brought to the end of the other hollow cylinder, thereby forming a longer cylinder that can, for example, have an elbow formed at their junction to allow angular changes in the hollow tunnel.

Since the channels 50 irrigate the body of the non-metallic chassis portion 15 with the fluid that is supposed to be used in the context of use (mainly for cooling), the network of channels 50 can be thought of as the arteries of a vascular system, which has a similar function of irrigating a body with a fluid.

The network of channels may advantageously be adapted to bring a greater quantity of fluid to a given point or area or volume within the chassis 10, and a lesser quantity of fluid, or no fluid at all, to other places within the chassis 10.

Advantageously, the various components within the chassis 10, most notably the various parts of the motherboard 70, can have their heat production quantified. For example, the power consumption of a given electronic component, namely one of the heat-generating elements 75, in the motherboard can be found in its specification and corresponds to the rate of heat production within the chassis 10 attributed to this specific component. Not all components generate heat at the same rate. The network of channels 50 can then be sized according to the heat production of these heat-generating elements 75. The non-metallic chassis portion 15 can thus be manufactured to be molded with such a network of channels 50 or modified to create such a network of channels 50 after molding. The direction and size of each channel 50, and any interaction between channels, should be known prior to creating the network of channels. A channel 50 may be molded, drilled or carved to ensure it is directed to a given heat-generating element 75 to which that specific channel would be dedicated, and the channel 50 is sized accordingly; for example, the cross-sectional area of this channel 50 can be in relation with the heat generation rate of that component (e.g., substantially proportional). This way, the plurality of channels 50 in the network can bring cooling fluid to the sites of heat generation within the chassis 10 with a flow rate that is substantially at a pro rata of the heat generation. If a first processor is considered to generate twice as much heat as a second processor, then the channel 50 which is directed to the first processor can be approximately twice as large (in cross-section area) as the channel 50 directed to the second processor. Since the motherboard 70 is added after the fabrication of the chassis 10, the channels 50 should have their starting and ending points located based on the eventual location of the fans and heat-generating elements 75.

The sizing of the channels may also differ from the described proportionality if needed. For example, if a component is more important or critical for the use of the computer, or if a component is more sensitive to a rising temperature, then this component may receive more than its share of cooling fluid and therefore the channel 50 directed to this component can be oversized in order to bring more fluid.

Alternatively, variable control over time of the airflow to the components based on the cooling needs of the heat-generating elements 75 is also possible. Accordingly, some of the channels 50 can be closed partly or completely, by a controllable door associated to one or more of the channels. According to an example, a network of controllable passages is included upstream of the channels 50. Alternatively (or in combination), a control mechanism is included to control individually the speed of the fans based on based the cooling needs of the heat-generating elements 75.

Furthermore, according to an embodiment, it is also possible to control the direction of airflow at the output of the channels 50 by including controllable slats in order to direct airflow the cooling needs of the heat-generating elements 75.

Also, according to another embodiment, the shape and size of the channel 50 is controllable and adaptable based on the cooling needs of the heat-generating elements 75. This is made possible by including a movable component in one or more of the channels 50, the movable component being able to vary the size of the inner cross-section of the channel, either by constructing an accessible portion of the channel from the outside, or buy occupying a variable and controllable portion inside the channel to act inside it as a sphincter.

According to an embodiment, the cooling needs of the heat-generating elements 75 are determined using temperature sensors which are in communication with one or more controllers. The controllers, in turn, are in communication with each of the aforementioned controllable devices to vary the control of the airflow to the heat-generating elements 75.

Figure 3:
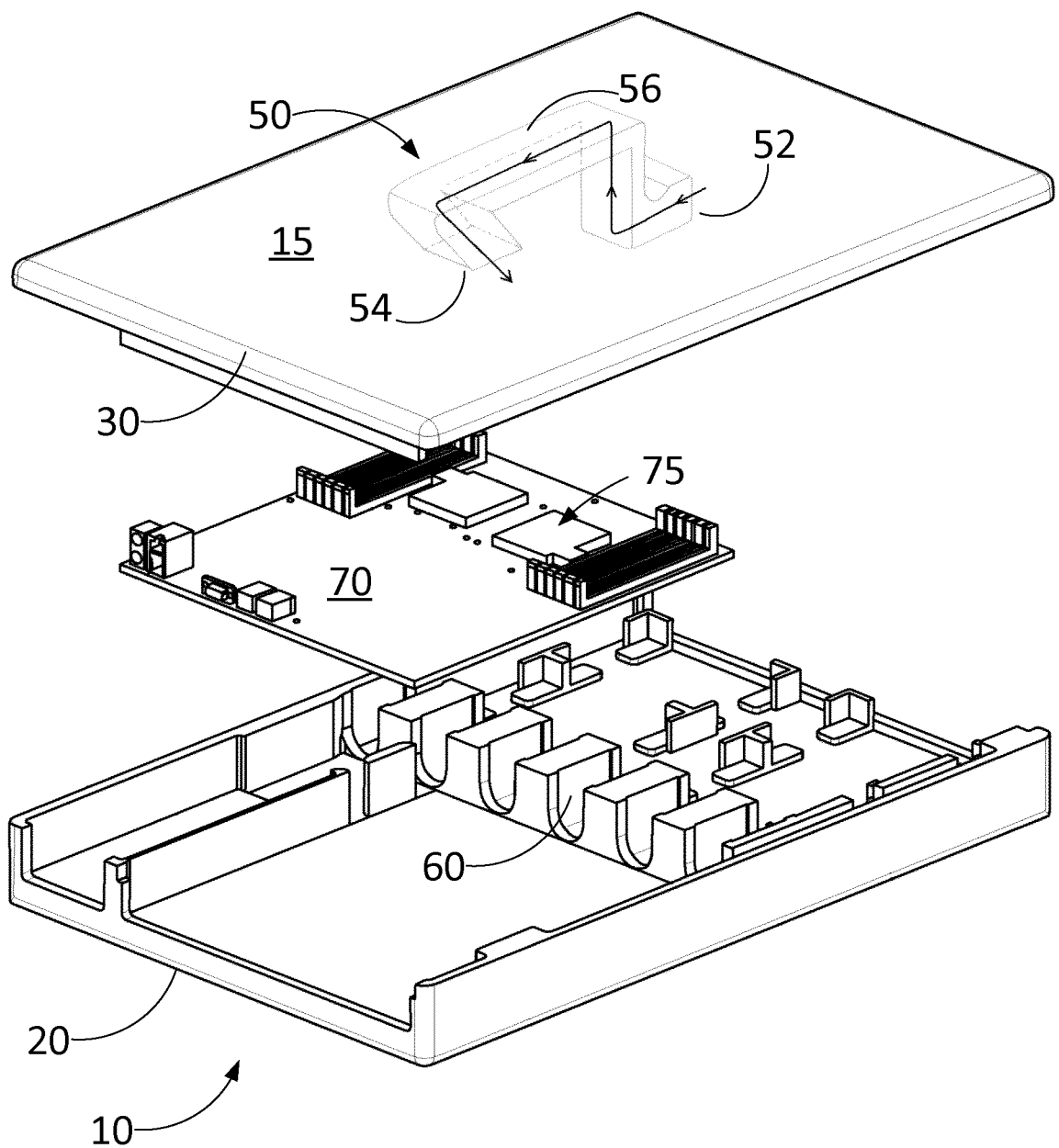
FIG. 3 is a perspective view illustrating a computer chassis with channels in a non-metallic portion of the chassis lid, according to an embodiment.
Figure 4:
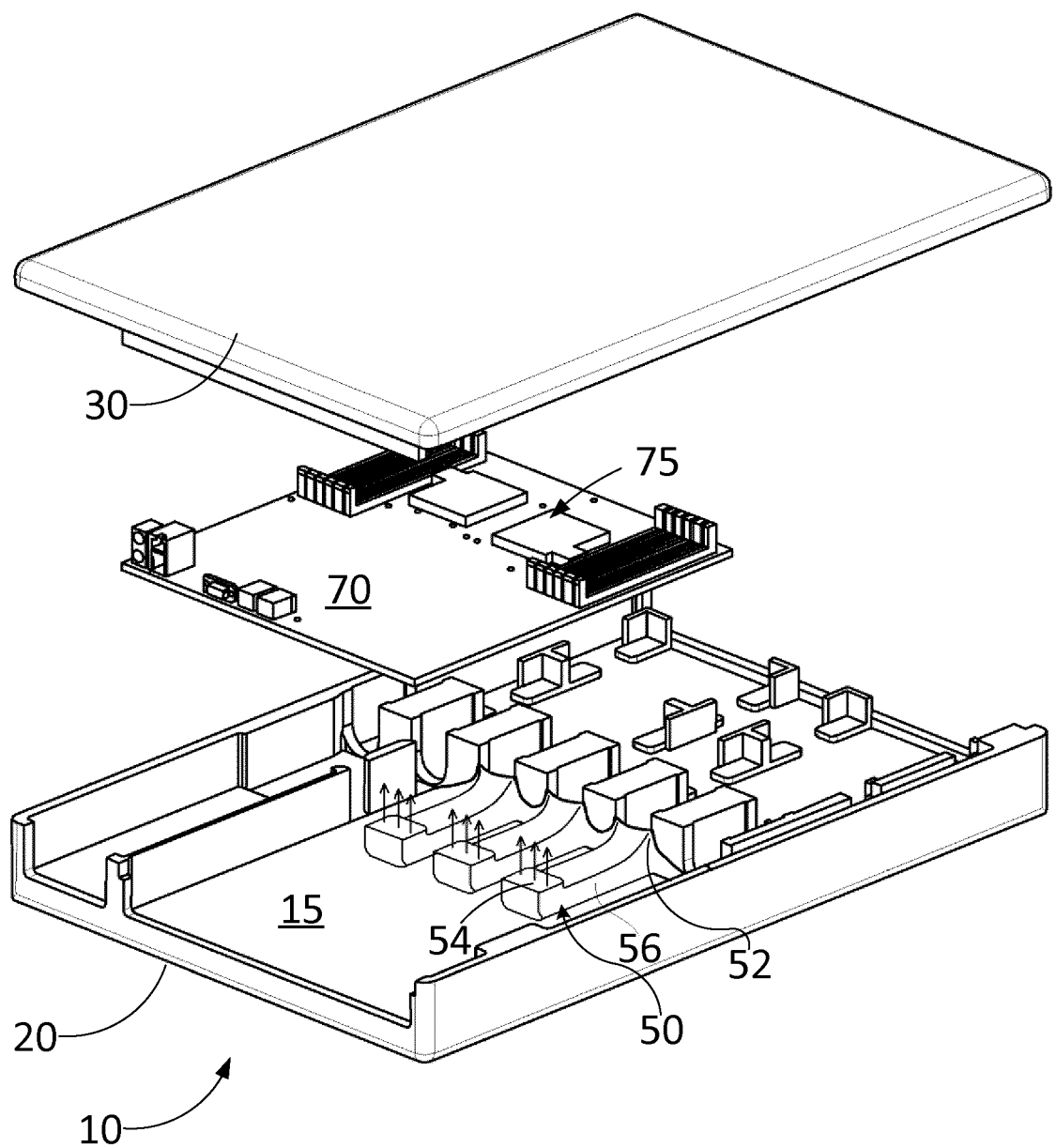
FIG. 4 is a perspective view illustrating a computer chassis with channels in a non-metallic portion of the chassis base, according to another embodiment.

The channel 50 can be provided in the chassis base 20, as shown in FIGS. 2 and 4, and/or the chassis lid 30, as shown in FIG. 3, depending on where non-metallic chassis portion(s) 15 is or are provided. Deciding where to provide the channel 50 is usually based on considerations such as the ease or cost of fabrication and the performance of air guiding in the final product. For example, some configurations may include corners or shapes that add resistance to the flow in the channel and may therefore introduce energy losses in the fluid flow within the channel 50. Furthermore, when the fans are put in place within the chassis, there may be a gap between the fan and the entrance of the channel 50; this gap may have to be greater if the channel 50 is provided in the chassis base 20 or in the chassis lid 30, depending on the context. This sort of consideration should be taken into account when deciding whether to provide channels 50 in the chassis base 20, in the chassis lid 30, or both.

In FIG. 3, which shows a channel 50 provided in the chassis lid 30, the channel 50 is shown in grey because it is provided under the surface of the chassis lid 30, i.e., the body 56 is inside the non-metallic material of the chassis lid 30, and the starting opening 52 and ending opening 54 extend below (i.e., under) the chassis lid 30, and should be open toward the fan location 60 and the heat-generating elements 75, respectively.

Since the purpose of the channel 50 is to guide a fluid from a location to another one, the channel 50 should comprise an entrance or starting opening 52 to collect incoming moving fluid, an exit or ending opening 54 where the guided moving fluid is delivered at the location where it is needed, and a body 56 inside which the channel 50 is formed for substantially confining the moving fluid and thereby substantially guiding it from the starting point (aka starting opening 52) to the ending point (aka ending opening 54). Normally, the fluid should be guided from the fan location 60 to the heat-generating element 75, preferably without interruption (i.e., confined along the whole length of the channel linking the fan location 60 to the heat-generating element 75), and also preferably without substantial irregularities that would add resistance to the flow and require additional power from the fan.

As mentioned above, in some cases, the channel 50 may be provided at the surface and therefore the body 56 does not completely confine the moving fluid. However, the channel 50 should keep a substantial fraction of the moving fluid within the channel 50 with a shape that favors such a confinement using the inertia of the moving fluid. This is analogous to a wind that is guided in a canyon; the wind may be greater in the canyon than above the walls of the canyon, and the wind will remain more or less confined in the canyon even though the canyon is open at the top. Depending on the characteristics of the flow, such as speed, viscosity, friction resistance by the walls of the channel 50, depth of the channel 50, length of the channel and existence of turns in the channel 50, the body 56 of the channel 50 may be able to efficiently guide fluid from the starting opening 52 to the ending opening 54 even though it is open. This configuration can be easier to manufacture because it involves acting on the surface of the non-metallic chassis portion 15; this can be done by designing the mold for providing the channel 50, open along its length, directly during the molding of the non-metallic chassis portion 15.

This configuration may be otherwise useful if there is a specific heat-producing element at the ending opening 54 of the channel 50 that needs substantial inflow of cooling fluid, and at the same time other less significant heat-producing elements along the length of the channel 50. The naturally-occurring leaks of cooling fluid along the length of the open channel 50 on the surface of the non-metallic chassis portion 15 may be sufficient to cool down the less significant heat-producing elements along the length of the channel 50, and the remaining fraction of the cooling fluid flowing through the channel 50 that reaches its ending opening 54 can effectively cool down the specific heat-producing element located there. The naturally-occurring leaks of cooling fluid along the length of the open channel 50 can be characterized (in laboratory or with simulation software tools) so that the sizing of the channel 50 renders the naturally-occurring leaks of cooling fluid along the length of the open channel 50 sufficient, but no more, for cooling down the less significant heat-producing elements along the length of the channel 50.

Alternatively, as mentioned above, the channel 50 may be provided inside the non-metallic chassis portion 15 or with walls defining a closed body 56, i.e., the channel 50 is closed. This is preferable from the point of view of performance in fluid guiding, because the body 56 is closed and can therefore fully confine the fluid flowing therein. This embodiment should be preferred if the naturally-occurring leaks are not desirable and if fluid guiding performance is prioritized over the ease of fabrication.

If the channel 50 is closed, it defines a tunnel which guides the fluid inside the non-metallic chassis portion 15. This tunnel defines a lumen that can have a circular cross-section, or a cross-section of any other suitable shape, including polygonal shapes of all sorts, or irregular shapes. However, some shapes, such as circular shapes and regular polygons, offer less resistance to the flow because they minimize the inner-surface of the body 56, including corners with such inner surface, that produce a resistance to the flow which causes losses in kinetic energy of the flow. A cross-section that reduces such resistance to the flow should therefore be preferred to avoid having to increase the electric power needed to feed the fans (or pumps) that propel the fluid. The surface of the cross-section may vary along the length of the channel 50, or not substantially vary, depending on various design considerations.

The various channels 50 in the non-metallic chassis portion 15 may also interact in the non-metallic chassis portion 15, for example they can merge or split. Put in another way, a channel 50 may have a plurality of starting openings 52 and/or a plurality of ending openings 54, where the numbers of both may be different.

Figure 6:
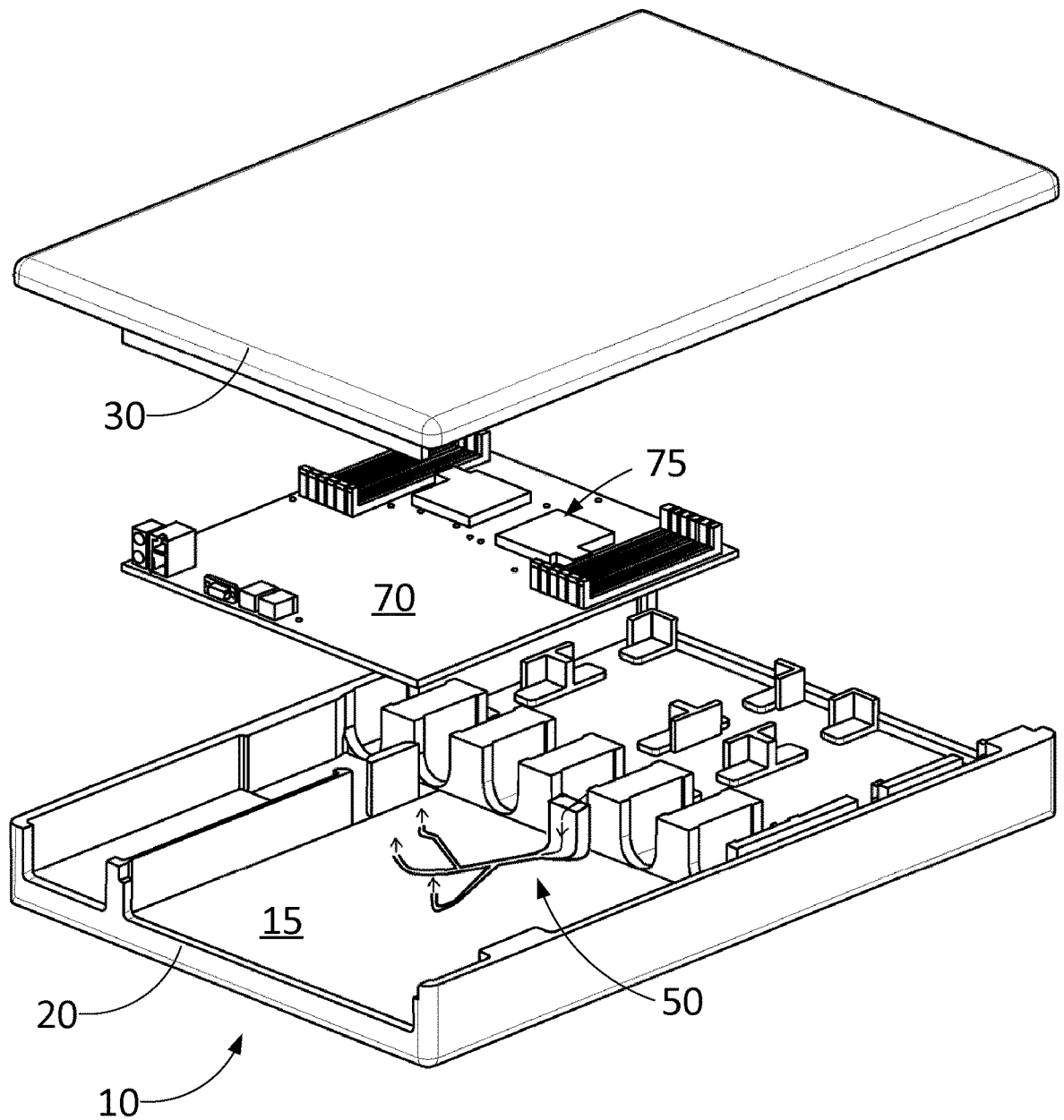
FIG. 6 is a perspective view illustrating a computer chassis with a channel comprising sub-channels in a non-metallic portion, according to an embodiment.

FIG. 6 shows a channel 50 having a plurality of fluid outlets (arrows in FIG. 6). A specific example where that could be desirable is a case where many heat-generating elements 75 are close together but far from the fans. A channel 50 starts from one of the fans and lead to the cluster of heat-generating elements 75, and close to the cluster of heat-generating elements 75, split into a multitude of sub-channels that "irrigate" the heat-generating elements 75 with fluid. By centralizing the fluid guiding in a larger channel 50 during most of the length of travel, fluid flow resistance is minimized. Close to the end, the channel splitting occurs to have a customized fluid delivery to the various heat-generating elements 75. The sub-channels may have different cross-section surfaces depending on the intensity of the fluid flow that needs to be provided at a specific location. FIG. 6 shows sub-channels extending from a primary channel and together forming the channel 50 having multiple ending openings 54. A "sub-channel" is intended to apply to a channel that originates from another channel located upstream the sub-channel. Sub-channels are useful when the number of heat-generating elements 75 is greater than the number of fan locations 60, i.e., there are more ending points in the network of channels than there are starting points.

Another example would involve a heat-generating element 75 that produces so much heat that the fluid coming from more than one fan would be needed for cooling. Two or more entrances for the channel 50 may be provided in front of each of these fans; their channels then merge into one large channel 50 that feeds directly the major heat-generating element 75.

If the manufacture process allows it, a fan can be provided within the channel 50. This configuration may be useful to avoid any leak at the entrance of the channel 50; however, this configuration may be harder to manufacture.

It will be understood that in prior art racks, the fluid propelled by fans can propel fluid in a variety of directions. Much of the propelled air is actually propelled in directions where no substantial cooling is required, notably due to turbulence and obstacles causing the flow to spread or deviate. Therefore, a significant fraction of the power needed to operate the fans is not useful. By using channels for first confining and then guiding the fluid to the specific locations where cooling is needed, preferably with a flow rate that corresponds to the needs of that specific heat-generating element 75, there are far less losses of propelled air in useless locations within the chassis, and more appropriate quantities are used for each specific location where cooling is needed, thereby resulting in a substantial reduction of fluid that needs to be propelled during the operation of a server, and a substantial reduction of the total power required to operate the fans for a given result in cooling.

These two advantages allow server designers to reduce the number of fans inside a server rack. Alternatively, or complementarily, it requires less electric power to feed the fans. There are thus savings in the precious space within the server rack, and/or a reduction in the electricity consumption of the server which constitutes a major cost of operating the server.

The addition of fluid-guiding channels is rendered achievable on a wide-scale manufacturing of server parts by the fact the channels 50 can be easily molded as a part of non-metallic chassis portions 15 that are manufactured by molding, for example by injection molding.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A chassis for a computing system comprising a heat-generating element, the chassis comprising:
    a body forming the chassis with at least a portion thereof made of a non-metallic material, namely a non-metallic portion, forming at least a portion of the chassis; and
    a channel made in the non-metallic portion forming at least the portion of the chassis, the channel having a starting point close to a dedicated location for a fan and downstream of the dedicated location for the fan, the channel having an ending point further downstream of the dedicated location for the fan and close to a dedicated portion for the heat-generating element, the channel shaped to guide fluid propelled between the starting point and the ending point, the channel made in the non-metallic portion comprising a tunnel defining a path between the starting point and the ending point.

2. The chassis of claim 1, wherein the non-metallic material comprises plastic.

3. The chassis of claim 1, wherein the chassis comprises a chassis base having a base flat portion extending in a plane, the non-metallic portion extending from the base flat portion away from the plane.

4. The chassis of claim 1, wherein the chassis comprises a chassis lid having a lid flat portion extending in a plane, the non-metallic portion extending from the lid flat portion away from the plane.

5. The chassis of claim 1, wherein the body has a surface and the channel comprises a valley open to the surface and defining a path between the starting point and the ending point.

6. The chassis of claim 1, wherein the channel comprises a plurality of channels, each channel having its starting point by a dedicated one of a plurality of fans and its ending point by a dedicated one of a plurality of heat-generating element.

7. The chassis of claim 1, wherein the channel comprises a plurality of channels, some of the channels sharing a starting point by a dedicated one of a plurality of fans, each of the channels having and its ending point by a dedicated one of a plurality of heat-generating elements.

8. The chassis of claim 1, wherein the channel comprises a plurality of channels, the channels defining a network having a plurality of starting points and a plurality of ending points greater than the plurality of starting points, the channels defining paths from the plurality of starting points and splitting to the plurality of ending points.

9. A chassis for a computing system, the chassis comprising at least a portion thereof made of plastic, namely a plastic portion forming at least the portion of the chassis and defining a channel made inside the plastic portion for ventilation, the channel having a starting point and an ending point which are both downstream or both upstream of a fan, the channel shaped to guide fluid between the starting point and the ending point, the channel made in the non-metallic portion comprising a tunnel defining a path between the starting point and the ending point.

10. The chassis of claim 9, wherein the channel comprises a plurality of channels, the channels defining a network having a plurality of starting points and a plurality of ending points greater than the plurality of starting points, the channels defining paths from the plurality of starting points and splitting to the plurality of ending points.

11. A chassis for a computing system comprising a heat-generating element, the chassis comprising:
    a body forming the chassis with at least a portion thereof made of a non-metallic material, namely a non-metallic portion, forming at least a portion of the chassis, the non-metallic portion being a single-molded portion and comprising a chassis base or a chassis lid having a flat portion extending in a plane, the non-metallic portion further extending from the flat portion of the chassis base or the chassis lid away from the plane and being integral with the flat portion of the chassis base or the chassis lid; and
    a channel made in the non-metallic portion forming at least the portion of the chassis, the channel having a starting point close to a dedicated location for a fan and downstream of the dedicated location for the fan, the channel having an ending point further downstream of the dedicated location for the fan and close to a dedicated portion for the heat-generating element, the channel shaped to guide fluid propelled between the starting point and the ending point.

\* \* \* \* \*